United States Patent [19]
Sauer et al.

[11] Patent Number: 5,951,704
[45] Date of Patent: Sep. 14, 1999

[54] TEST SYSTEM EMULATOR

[75] Inventors: Robert F. Sauer; Kiyoshi Fukushima; Hiroaki Yamoto, all of Santa Clara, Calif.

[73] Assignee: Advantest Corp., Tokyo, Japan

[21] Appl. No.: 08/802,857

[22] Filed: Feb. 19, 1997

[51] Int. Cl.⁶ ..................................................... G06F 9/455
[52] U.S. Cl. .......................................... 714/736; 395/500
[58] Field of Search ................................... 371/25.1, 27.1, 371/27.4, 20.4, 22.1, 22.6; 395/500, 181, 183.07, 183.03, 183.21, 180, 183.02, 183.05, 183.09, 183.14; 364/578, 579, 580, 488, 489, 490

[56]         References Cited

U.S. PATENT DOCUMENTS

| | | | |
|---|---|---|---|
| 5,136,590 | 8/1992 | Polstra et al. | 371/16.2 |
| 5,363,501 | 11/1994 | Pullela | 395/500 |
| 5,425,036 | 6/1995 | Liu et al. | 371/23 |
| 5,438,672 | 8/1995 | Dey | 395/500 |
| 5,475,624 | 12/1995 | West | 364/578 |
| 5,541,862 | 7/1996 | Bright et al. | 364/580 |
| 5,546,562 | 8/1996 | Patel | 395/500 |
| 5,581,491 | 12/1996 | Biwer et al. | 364/580 |
| 5,642,478 | 6/1997 | Chen et al. | 395/183.21 |

*Primary Examiner*—Robert W. Beausoliel, Jr.
*Assistant Examiner*—Nadeem Iqbal
*Attorney, Agent, or Firm*—Muramatsu & Associates

[57]         ABSTRACT

An emulator software in a semiconductor test system for emulating hardware in the semiconductor test system as well as a semiconductor device to be tested without need to use an actual test system hardware. The emulator software includes an emulator unit which emulates a function of each hardware unit of the test system, a device emulator which emulates a function of a semiconductor device to be tested, a data collecting part for acquiring data from the emulator unit necessary for carrying out a test program, and a device test emulator which generates a test signal to be applied to the device emulator based on the acquired data and compares the resultant signal from the device emulator with the expected data and stores the comparison result therein. In the other aspect, the emulator is combined with the operating system of the semiconductor test system which is capable of easily modifying the software when there is a change or replacement of the hardware of the test system so that the transmission of the control data for the hardware and its operation or the development of the test program can be carried out without using the hardware of the test system.

3 Claims, 4 Drawing Sheets

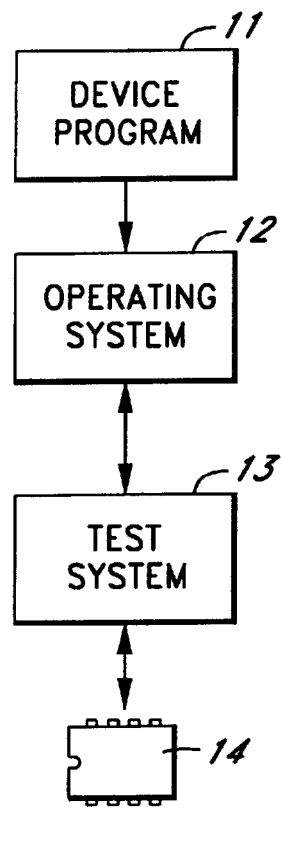
FIG. 1
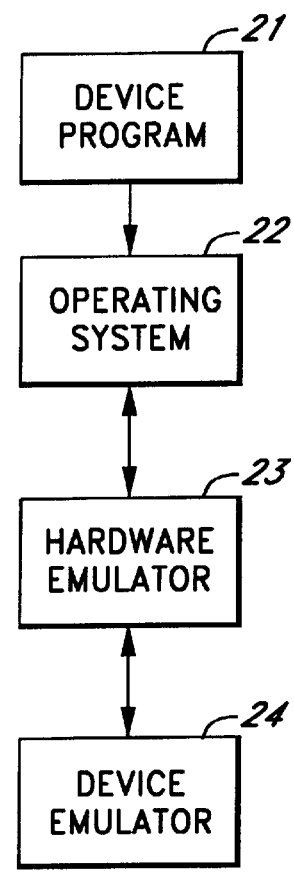
FIG. 2
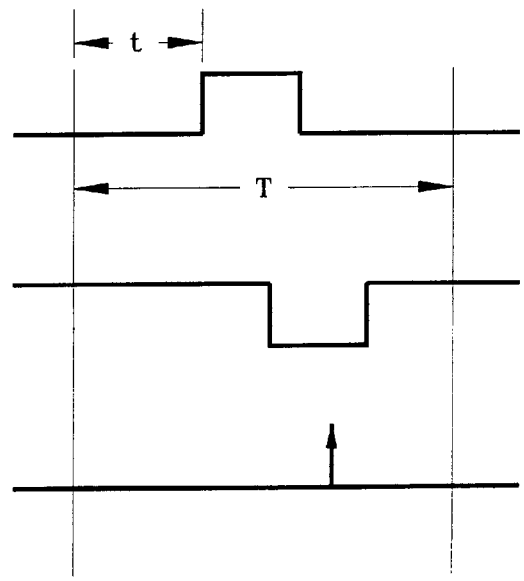
FIG. 6A
FIG. 6B
FIG. 6C

TEST SYSTEM EMULATOR

FIELD OF THE INVENTION

This invention relates to a semiconductor test system for testing semiconductor devices such as an IC, and more particularly, to a semiconductor test system emulator for emulating hardware in a semiconductor test system or even a semiconductor device to be tested by the semiconductor test system without the hardware of the test system. Furthermore, this invention relates to a semiconductor test system emulator to be used with an operating system which is capable of easily modifying a software when there is a change in a hardware of the semiconductor test system.

BACKGROUND OF THE INVENTION

In a semiconductor test system for testing semiconductor devices, a test signal pattern called a test vector is provided to a semiconductor device under test and a resultant output from the semiconductor device is compared with an expected value signal established in advance to determined whether the semiconductor device under test works correctly or not. Generally, the test vector is produced through a test program. The languages in the test program are unique to manufacturers of the semiconductor test system and vary from manufacture to manufacture. To sufficiently test complicated computer chips or large scale semiconductor memories, for example, a semiconductor test system must perform complicated and sophisticated test at high speed. Therefore, an actual structure of the semiconductor test system is a structure of a large scale computer system. Consequently, a large scale software including the above noted test program is used to control the test and other operations of the semiconductor test system.

In the semiconductor production industry, there is a strong demand to improve efficiency of a semiconductor test system. This is because that a recent semiconductor test system is a complicated and expensive system and price competition of semiconductor devices is fierce. Therefore, an exclusive use of the semiconductor test system for a process such as producing a test program for semiconductor devices to be tested must be avoided. Further, it is desired that the newly produced test program in such a process be evaluated and confirmed without using the hardware of the semiconductor test system.

As a consequence, in a modern, high end semiconductor test system, an emulator is frequently employed. However, in a conventional semiconductor test system, an emulator is only to emulate an operating system of the semiconductor test system, and thus, its function is not sufficient. For example, the conventional emulator is not able to perform the level of emulation in which the test for a specific semiconductor device is executed by applying test vectors to the semiconductor device to be tested and analyzing the resultant signals from the device.

Because of the rapid improvement in the technology of the semiconductor devices, a semiconductor test system for testing such rapidly changing semiconductor devices is frequently required to be expanded, modified or replaced with a new model. For example, in a test pattern generator of a semiconductor test system which generates test vectors to be applied to semiconductor devices under test, in addition to the function of generating a test pattern of a relatively normal and simple sequence, an algorithmic pattern generator may be added to generate a test pattern having mathematical sequence. In such a situation where the change or addition of the hardware resources is made, it is necessary to accordingly modify the software to control the hardware that has been newly added or modified. This usually includes the process of transferring the appropriate data to internal registers in the newly added or modified hardware.

In the conventional technology, such a modification of the software in accordance with the change in the hardware is not easily carried out. For example, in such a situation, the conventional technology requires a complicated modification procedure of the software and thus involves long works. Further, to carry out a work for such a software modification, it is usually necessary to use the hardware which has actually been changed or added. Thus, it is desired in the industry to develop means for easily carry out the modification of the software in accordance with the change or addition in the hardware of the semiconductor test system prior to the actual change or addition of the hardware. It is also desired that such modification of software or the development of test program and its debugging associated with the change or addition of the hardware be made only by emulating such hardware without using the actually hardware to be added to the system.

SUMMARY OF THE INVENTION

Therefore, it is an object of the present invention to provide an emulator to be used in a semiconductor test system for testing a semiconductor device which is capable of producing a test program or confirmation of the operation of the test program without using the hardware resources of the semiconductor test system.

It is another object of the present invention to provide an emulator to be used in a semiconductor test system for testing a semiconductor device which is capable of producing a test program and debugging the test program with further detailed and specific levels, such as applying a test signal to the device to be tested and evaluating the resultant output signals from the device to be tested.

It is a further object of the present invention to provide an emulator for a semiconductor test system which is capable of easily and quickly utilizing the software resources obtained in the production or application processes of the semiconductor test system to a newly added hardware, a modified hardware or a separate test system such as a newly modeled semiconductor test system without using the actual hardware of the test system.

The semiconductor test system of the present invention includes an emulator unit which emulates a function of each hardware unit of the test system, a device emulator which emulates a function of a semiconductor device to be tested, means for acquiring data from the emulator unit necessary for carrying out a test program, and a device test emulator which generates a test signal to be applied to the device emulator based on the acquired data and compares the resultant signal from the device emulator with the expected value data and stores the comparison result therein.

In the other aspect of the semiconductor test system of the present invention wherein a test signal is applied to a semiconductor device under test in synchronism with a reference period and the resultant output of the semiconductor device under test is compared with an expected value signal to determine whether the semiconductor device functions correctly or not, the semiconductor test system includes:

means for providing a test program for specifying various test conditions necessary to test the semiconductor device under test including a waveform of a test signal to be supplied to a predetermined terminal of the semiconductor device under test, compiler means for converting the test program to an object code and interpreting the contents of the test program, compiler interface means for storing data indicating the hardware characteristics of the semiconductor test system in a table format to assist the interpretation of the test program in the compiler means and modifying the table format data in response to the change in the hardware, library means having data tables based on the specification of the semiconductor test system for converting the format of the data compiled and interpreted by the compiler means to data of a hardware format, driver means for transmitting the hardware format data to a data bus to transfer the data to registers in the hardware of the semiconductor test system, and an emulator which receives the data formed by said library means from the driver means and stores the data in an assigned memory area and emulates the specification and operation of each of said hardware based on the data stored in the memory area.

According to the emulator for semiconductor test system of the present invention, functions of the hardware in the semiconductor test system can be emulated without the hardware. Further, even the test signal generation by the hardware, the resultant signal generation by the device under test, and the comparison of the resultant signal with the expected data can be emulated without the hardware of the semiconductor test system. In other words, since the emulation is performed for the level of specific test for the semiconductor device to be tested, development of the device program or its debugging can be completely carried out without the hardware of the test system.

Further, in the semiconductor test system of the present invention, when there is a change or replacement in the hardware of the semiconductor test system, the semiconductor test system of the present invention can easily and quickly modify the software for controlling the newly added or replaced hardware. Furthermore, when there is a change or replacement in the hardware, the semiconductor test system of the present invention can carry out the modification of the software for controlling the new hardware without needs to consider the compiler. Moreover, in the present invention, when there is a change or replacement in the hardware of the semiconductor test system, the control data for the hardware is stored in the emulator and the confirmation of the control data or the development of the device program or its debugging can be carried out without the hardware of the semiconductor test system.

BRIEF DESCRIPTION OF THE DRAWINGS

FIG. 1 is a block diagram showing an overall schematic structure of the semiconductor test system including hardware and software.

FIG. 2 is a block diagram showing the overall schematic structure of the semiconductor test system of FIG. 1 expressed by the emulator functions of the present invention.

FIGS. 6A, 6B, 6C are a timing chart showing signal waveforms for emulating the semiconductor device test in accordance with the present invention.

DETAILED DESCRIPTION OF THE PREFERRED EMBODIMENTS

Figure 3:
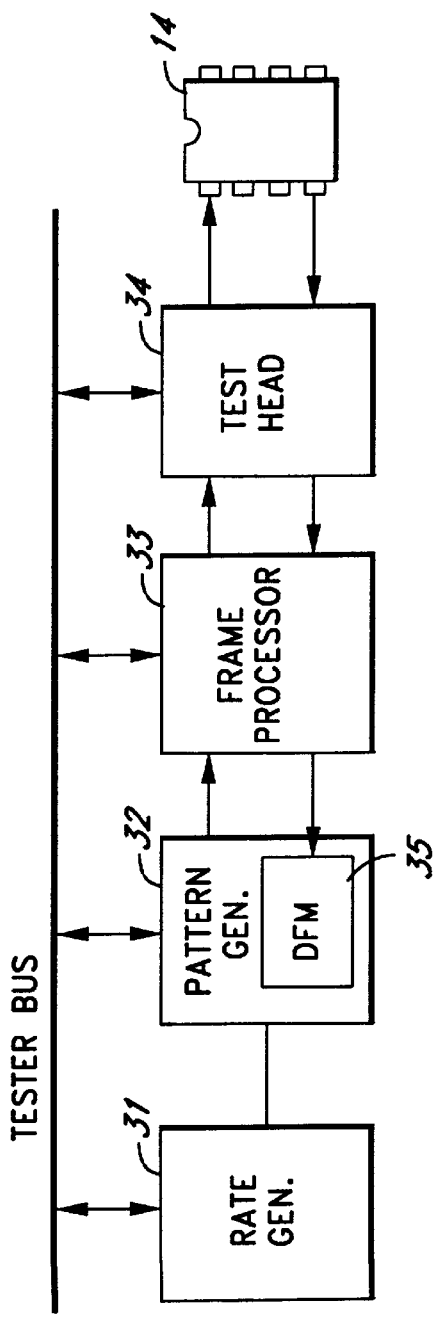
FIG. 3 is a block diagram showing hardware blocks of the semiconductor test system with respect to the connection to the semiconductor device to be tested.

Basic structure of the overall semiconductor test system is shown in a block diagram of FIG. 1. A test program (device test program) 11 for testing a semiconductor device is created depending on the kinds and purposes of the test for a semiconductor device 14 and is installed in the semiconductor test system. Generally, the device program 11 is produced by the user of the semiconductor test system according to the types and test items of the semiconductor device 14 to be tested. In the device program 11, various parameters are specified such as a frequency, waveform, delay time and amplitude of the test signal to be applied to each terminal of the semiconductor device 14 to be tested and an expected value signal that should be derived from the device 14 under test when it is provided with the test signal. For example, the device test program is written by a test description language (TDL) based on a hardware description language HDL or VHDL.

The semiconductor test system is formed of an operating system 12 for monitoring and supervising each program operation of the test system and an hardware system (tester hardware) 13. The tester hardware 13 is connected to the operating system 12 through a hardware bus, i.e., physical bus lines (tester bus). The test signal (test vector) is provided to the semiconductor device 14 under test from the tester hardware 13 and the resultant output signal from the device 14 under test is received by the tester hardware 13. In the tester hardware 13, the output signal from the device 14 under test is compared with the expected value defined by the device program 11 to determine whether the device under test works correctly or not.

FIG. 2 is a block diagram showing the overall schematic structure of the semiconductor test system of FIG. 1 expressed by the emulator functions of the present invention. Namely, the emulator of the present invention makes it possible to perform, solely by the software, the overall operation of the semiconductor test system and also the test operation to be performed by the semiconductor test system for the intended semiconductor device. In FIG. 2, a device program 21 and an operating system 22 are the same as the device program 11 and the operating system 12, respectively, of the actual semiconductor test system of FIG. 1. The operating system is connected to a tester hardware emulator 23 through an imaginary bus line formed of the software.

The tester hardware emulator 23 emulates the structure and operation of the hardware of the semiconductor test system. A device emulator 24 is to emulate the functions of the semiconductor device 14 under test shown in FIG. 1. The device emulator 24 is connected to the tester hardware emulator 23 through the software. The device emulator 24 receives an imaginary test signal from the tester hardware emulator 23 and produces an imaginary output signal which is a signal resultant to be produced by the intended device under test. The imaginary output signal from the device emulator 24 is compared with the expected data by the tester hardware emulator 23. In the foregoing structure of the emulator, the development of the device program and its debugging can be performed without using the actual hardware of the semiconductor test system.

FIG. 3 is a block diagram showing hardware blocks of the semiconductor test system with respect to the connection to the semiconductor device to be tested. In this example, the hardware of the semiconductor test system is formed of each hardware block of a rate generator 31, a pattern generator 32, and a frame processor 33. These hardware blocks are connected with one another through a tester bus and are monitored and controlled by the operating system 12 shown in FIG. 1. Each hardware block has a register therein for storing the necessary software to perform its operation.

The rate generator 31 generates a test vector rate, i.e., a test signal period (test rate) based on the device test program. The pattern generator 32 generates, based on the device test program, a test signal to be applied to the semiconductor device 14 under test. The pattern generator 32 may include a device fail memory (DFM) 35 to store the information regarding the test results. The frame processor 33 formats the waveform of the test signal from the pattern generator 32 and produces rise and fall timings of the test signal. By the frame processor 33, the test signal is formatted to, for example, an RZ (return to zero) waveform, an NRZ (non-return to zero) waveform, or an EOR (exclusive OR) waveform. The frame processor 33 further determines, based on the timing data from the rate generator 31, delay timings of the test signal within the test rate and strobe timings for which the comparison operation is carried out by a comparator circuit which will be described later.

The test head 34 is to interface between the semiconductor test system and the semiconductor device 14 under test. When the semiconductor device 14 is mounted on the test head, the test signal which has been wave formatted is provided to the semiconductor device 14 through the test head 34. As a result of the application of the test signal, the resultant signal is produced by the semiconductor device 14 under test. The test head 34 includes a comparator circuit which compares the resultant signal from the semiconductor device 14 and the expected value defined by the device program and determines whether the resultant signal is acceptable or not. The comparison timings in the comparator circuit are defined by the strobe signals generated by the frame processor 33. The comparison results are stored in the device fail memory 35 provided, for example, in the pattern generator 32 as noted above.

Figure 4:
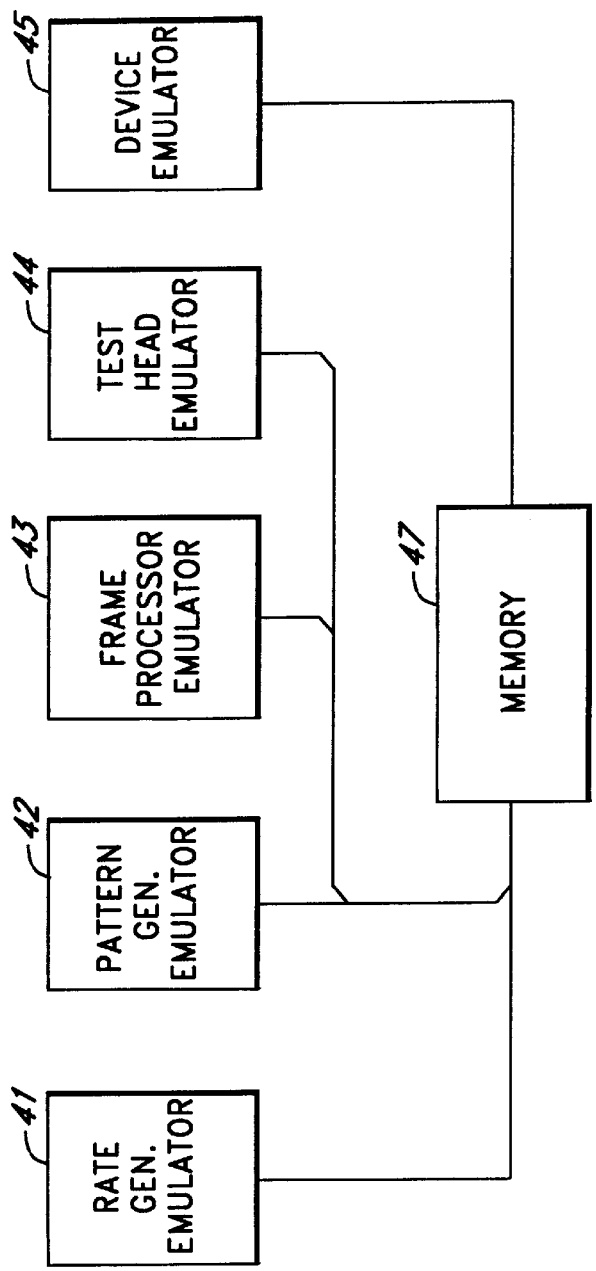
FIG. 4 is a block diagram showing the test structure expressed by the emulator functions of the present invention with respect to the hardware blocks of the semiconductor test system and the semiconductor device to be tested shown in FIG. 3.

FIG. 4 is a block diagram showing the test structure expressed by the emulator functions of the present invention with respect to the hardware blocks of the semiconductor test system and the semiconductor device to be tested shown in FIG. 3. The emulator units in FIG. 4 one-to-one correspond to the hardware blocks of FIG. 3. Namely, in FIG. 4, a rate generation emulator 41 emulates the test rate generation function of the rate generator 31. A pattern generation emulator 42 emulates the test signal generation function of the pattern generator 32. A frame processor emulator 43 emulates the functions of the wave formatting and timing determination by the frame processor 33. A test head emulator 44 emulates the functions of the test head 34 by supplying the test signal to a device emulator 45 and comparing the resultant output signal with the expected value. The device emulator 45 emulates the operation of the semiconductor device 14 under test.

Each emulator unit in FIG. 4 includes data corresponding to the contents of the physical register in each of the hardware blocks of FIG. 3. Therefore, an overall emulator of FIG. 4 is a large scale register or memory in which the data of each emulator unit is arranged in the corresponding storage area. When emulating the operation of each hardware block, the data in the corresponding storage area is read out and evaluated. In a case where the test rate described by the device test program is without the acceptable range of the rate generator emulator, such test rate cannot be set in the rate generator 31. In such a case, a notice will be provided by the emulator based on the data in the rate generation emulator 41 that such settings in device program is inappropriate.

To perform an imaginary test for the intended semiconductor device by the emulator of the present invention, it is necessary to produce a test signal by acquiring necessary data from each of the emulator units. A memory 47 is provided in the emulator to store the data from the emulator units. When the device program is set, the data necessary for generating the test signal having the test rate, test data, signal waveforms defined by the device test program are taken out by each of the emulator units and stored in the memory 47. By using the data in the memory 47, the emulator generates the test signal which is defined by the device program and is applied to the imaginary semiconductor device and the emulator compares the resultant signal to emulate the operation of the device evaluation. According to the foregoing functions of the emulator, the development of the device program and its debugging can be performed without using the actual hardware of the semiconductor test system. Further, by the device program thus developed and debugged, it is able to confirm whether the intended test for the intended semiconductor device can be properly performed.

Figure 5:
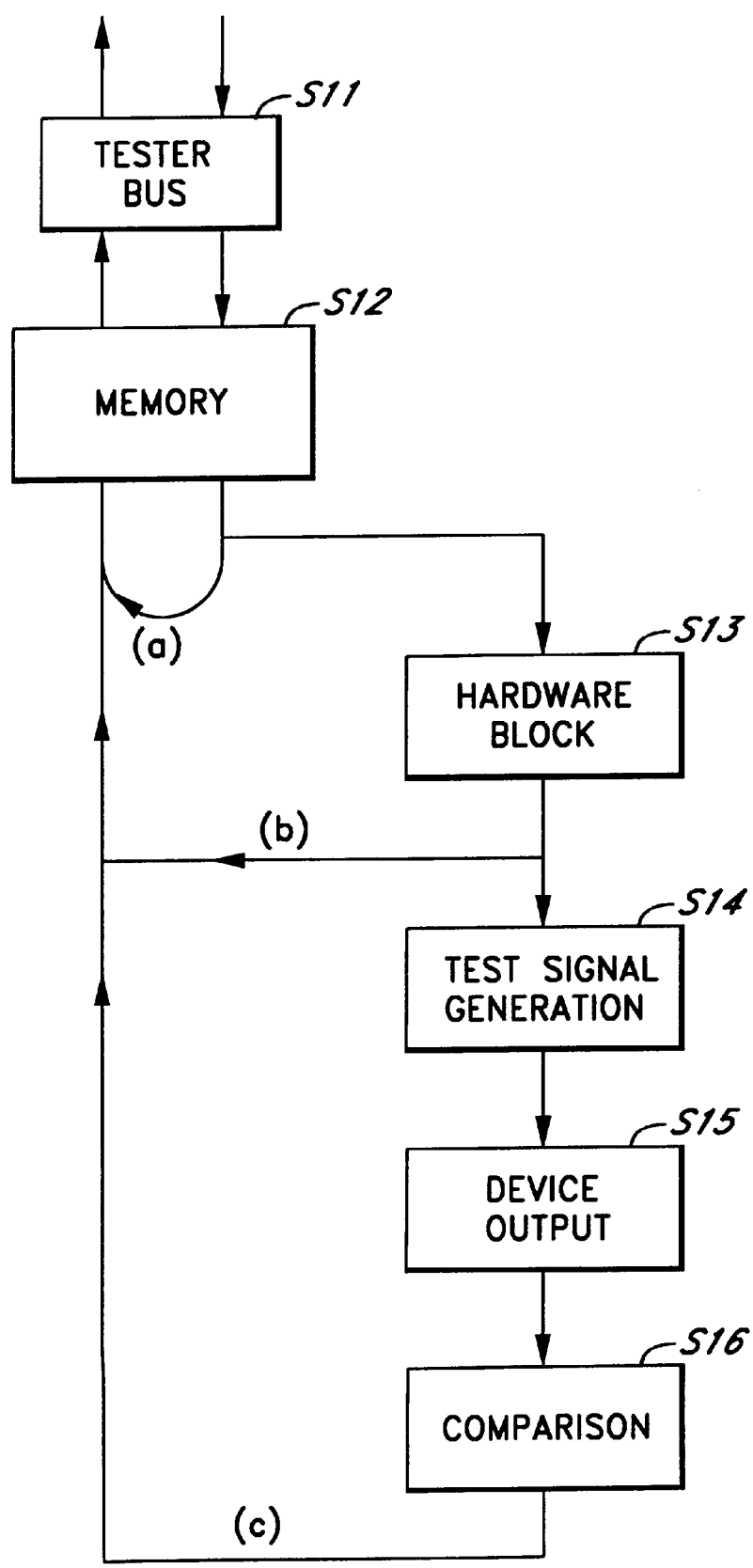
FIG. 5 is a flow chart showing the basic operation of the emulator of the present invention using separate operational flows.

FIG. 5 is a flow chart showing the basic operation of the emulator of the present invention using separate operational flows (layers). The example of FIG. 5 has three operational flows of the emulator. When the device program is produced by means of a language such as TDL, the device program is interpreted by the operating system and is transmitted as address and data to each register in the hardware of the semiconductor test system. In performing the emulator operation, the address and data are transferred to the memory in the emulator in the step 12 through the imaginary tester bus in the step 11. The memory areas are provided in the emulator corresponding to the registers in the hardware of the semiconductor test system. If the device program is proper, the data to be provided to the memory areas in the emulator should be also proper and can be stored in the memory area. Therefore, in case where the emulator is used only for evaluating whether the data that should be transferred to the hardware blocks of the test system is proper, the result of the emulation is returned to the operating system through the loop (a).

On the other hand, in case where the emulator is used for evaluating whether the operations in the hardware are proper or not, such an emulator operation is carried out in the flow of the loop (b). Namely, in the step 13, the operation of each of the hardware blocks is emulated based on the data stored in the memory area. The emulator corresponding to the hardware of the test system is configured as shown in FIG. 4 as noted above. The result of the emulation is returned to the operating system through the loop (b).

Further, in case where the emulator is used for evaluating whether the operations of the application of the test signals to the intended semiconductor device and the comparison of the resultant signal with the expected data can be properly performed based on the device program, such an emulation operation is carried out in the flow of the loop (c). In this flow, in the step 14, the test signal to be applied to the device under test is emulated. In the step 15, the situation in which the test signal is applied to the device under test is emulated. Thus, in the step 15, the signal resulted from application of the test signal to the device is emulated and obtained from the device under test. In the step 16, the operation of comparing the resultant signal from device under test obtained in the step 15 with the expected data is emulated. In acquiring the comparison results, the process goes back to the step 14 wherein the next test signal is emulated. These emulation operations of applying the test signal and comparing the resulted signal are repeated until the end of the device test program with the test rate defined by the device program.

FIG. 6 is a timing chart showing signal waveforms for emulating the application of the test signal to the semiconductor device under test, generating the resultant signal by the device under test and comparing the resultant signal with the expected data, in accordance with the flow (c) of FIG. 5. The test signal shown in FIG. 6A is generated with the test rate T, the delay time t and the waveform as defined by the device test program and is applied to the device under test. A resultant output signal from the intended device is generated which is determined by the characteristics of the device under test. The resultant output signal is compared with the expected data with the strobe timing shown in FIG. 6C defined by the device test program.

Figure 7:
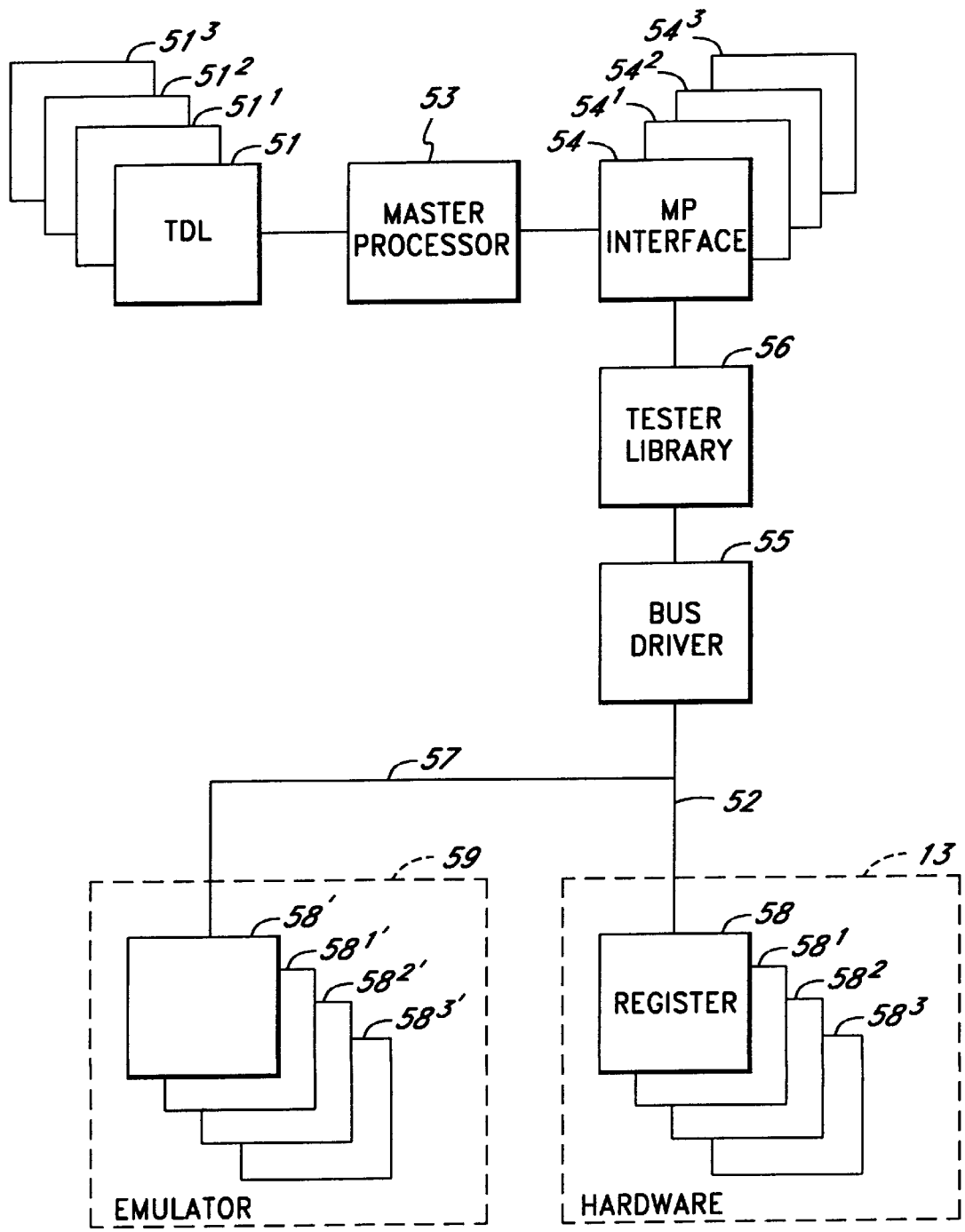
FIG. 7 is a block diagram showing another embodiment of the present invention in which the emulator of the present invention is combined with the software of the semiconductor test system which is capable of easily modifying the software when there is a change or replacement of the hardware of the test system.

FIG. 7 is a block diagram showing another embodiment of the present invention in which the emulator of the present invention is combined with the operating system of the semiconductor test system which is capable of easily modifying the software when there is a change or replacement of the hardware of the test system. In this embodiment, the evaluation of control data associated with the change and addition of the hardware, the development of the device program and its debugging can be performed without using the hardware of the test system.

The semiconductor test system of the present invention makes it possible to set a control program data corresponding to the replacement or addition of the hardware by simply providing additional data in a sentence format on a table as well as adding library data. Such a modification of the control program is independent of the compiler function. Further, by changing definitions in a register, the change or addition of the hardware can be easily made in the present invention.

The example of FIG. 7 is formed of a test program 51, a master processor 53, a master processor (MP) interface 54, a tester library 56, a bus driver 55, a tester bus 52, an imaginary tester bus 57, and an emulator 59. By this arrangement, the compilation and interpretation of the test program is pursued by the master processor 53 independently from the data regarding the structure of the hardware in question. In other words, the master processor 53 is not directly involved in the procedures of transferring the control data for carrying out the test to registers 58 in the hardware 13.

In the example of FIG. 7, the test program 51 is a program described by a test description language (also be referred to "TDL"). The test description language is structured by a hardware description language such as HDL or VHDL. The test program 51 has a form of source code. The user provides necessary test parameters in the test program to define the test operation in the hardware of the semiconductor test system. When the hardware is modified or added, the structure of the test description language (TDL) involving the test of the hardware is modified accordingly.

The master processor (also be referred to as "MP") 53 is basically a compiler which is called as a TDL compiler or just-in-time compiler by the assignee of the present invention. The master processor 51 converts the test program TDL which is the source code to the object code and interprets the test program. The master processor 51 then provides the control data to the corresponding hardware of the semiconductor test system.

The MP interface (also be referred to as "MPI") 54 works as a table mapping function for providing data necessary for the interpretation to the master processor 51. The table map of the MP interface 54 includes a list of data having a sentence format for judging the grammar of the TDL language and program libraries for perusing the judgement. The new data corresponding to the addition or modification of the hardware is made by adding a table in the MP interface 54. In receiving the information data regarding the grammatical structure of the TDL language in the sentence form from the MP interface 54, the master processor 51 performs the compilation and interpretation operations for the test program based on the information data. As a result of the interpretation by the master processor 51, the corresponding program library in the MP interface 54 is executed and the test data described in TDL is transferred to the tester library 56.

The tester library 56 converts the format of the test data from the MP interface 54 based on the specifics of the hardware. For example, voltage values or time values of the test signal received in a floating point form are converted to a sequence of bits that can be interpreted by the hardware. Further, the actual limiting parameters corresponding to the test program are defined based on the limits of the parameters, such as a voltage, current, frequency, etc. for each of the hardware of the semiconductor test system. The bus driver 25 is a driver for sending data to each of the registers in the hardware of the semiconductor test system through a data bus.

In the configuration of the present invention, prior to the operation of the test system, the master processor 53 instructs to load the data and program to be installed in the MP interface based on hardware of semiconductor test system. If the hardware is newly added, by interpreting the test program in consideration of the data and program associated with such an addition of the hardware, the newly added hardware in the semiconductor test system can be effectively used.

As an example, it is assumed in the following that hardware is newly added to the semiconductor test system and thus it is necessary to store the control data to registers $58^1$, $58^2$ and $58^3$ in the new hardware as shown in FIG. 7. Corresponding to the newly added hardware, tables $54^1$, $54^2$ and $54^3$ are added in the MP interface at the start of the operation. The contents of the tables are formed of, for example, data in a sentence form for determining the grammar of the TDL language and the program to carry out the determination.

Ordinarily, according to the change in the hardware, it is necessary to change the structure of the test program. In such a case, as shown in FIG. 7, test programs $51^1$, $51^2$ and $51^3$ will be added, if necessary. The tester library 56 produces a parameter table, as a source program, for data conversion corresponding to the specifics of the new hardware. The tester library is described, for example, by C-language.

In receiving the newly acquired data in the tables $54^1$, $54^2$ and $54^3$ from the MP interface, the master processor 53 interprets the program from the test program 51 based on the table data. Since the test programs $51^1$, $51^2$ and $51^3$ are added when necessary, the compilation and interpretation of these test programs are carried out by the master processor based on the corresponding data of the tables $54^1$, $54^2$ and $54^3$ from the MP interface. As a result, the data defined in the test program is provided to the tester library 56 through the MP interface 54. The tester library 56 converts the format of the received data produced through the data in the tables $54^1$, $54^2$ and $54^3$ of the MP interface to a data format that can be received by the hardware, and supplies the format converted data to the bus driver 25. The control data is transferred and stored in the registers $58^1$, $58^2$ and $58^3$ in the hardware 13 through the bus driver 55 and the tester bus 52.

Instead of storing the control data in the registers $58^1$, $58^2$ and $58^3$ in the hardware 13, in the present invention, the control data from the bus driver 55 may also be transferred to the emulator 59 through the imaginary data bus 57. In a case where the hardware 13 of the semiconductor test system is not easily available, by the use of the emulator 59 in place of the hardware 13 to be added or modified, the development of the software and confirmation of its operation can be carried out. As exemplified in FIG. 4, the emulator 59 is configured to include the emulator units for emulating the functions of the corresponding hardware blocks. Each of the emulator units is organized in a designated memory area 58'.

In this example, the memory areas $58^{1'}$, $58^{2'}$ and $58^{3'}$, which correspond to the registers $58^1$, $58^2$ and $58^3$ in the hardware 13 that are to be added, are designated. The data which has been format converted by the tester library 56 is transferred to the memory areas $58^{1'}$, $58^{2'}$ and $58^{3'}$ through the bus driver 55 and the imaginary tester bus 57. The emulation is carried out based on the data received in this manner to examine the functions of the hardware blocks that are to be added to the test system. Therefore, with the use of the emulator, the propriety of the control data for the hardware or the development of the device program and its debugging can be performed without the hardware.

As described in the foregoing, according to the semiconductor test system of the present invention, functions of the hardware in the semiconductor test system can be emulated without the hardware. Further, even the test signal generation by the hardware, the resultant signal generation by the device under test, and the comparison of the resultant signal with the expected data can be emulated without the hardware of the semiconductor test system. In other words, since the emulation is performed for the level of specific tests for the semiconductor device to be tested, the development of the device program or its debugging can be completely carried out without the hardware of the test system.

Further, in the semiconductor test system of the present invention, when there is a change or replacement in the hardware of the semiconductor test system, the semiconductor test system of the present invention can easily and quickly modify the software for controlling the newly added or replaced hardware. Furthermore, when there is a change or replacement in the hardware, the semiconductor test system of the present invention can carry out the modification of the software for controlling the new hardware without needs to consider the compiler. Moreover, in the present invention, when there is a change or replacement in the hardware of the semiconductor test system, the control data for the hardware is stored in the emulator and the confirmation of the control data or the development of the device program or its debugging can be carried out without the hardware of the semiconductor test system.

What is claimed is:

1. A semiconductor test system for testing a semiconductor device by applying a test signal to a semiconductor device under test in synchronism with a reference period and comparing the resultant output of the semiconductor device under test with an expected value to determine whether the semiconductor device functions correctly or not, comprising:

a tester emulator which emulates a function of each hardware unit of the test system to such a degree that operations of registers in the hardware unit are emulated, and the tester emulator including:

a rate emulator unit for generating data defining a test signal period;

a pattern generation emulator unit for generating a test signal based on the test program; and a frame processor emulator unit for formatting the test signal based and producing timings of the test signals based on the data from the rate emulator unit and the pattern generation emulator unit;

a device emulator which emulates a function of a semiconductor device to be tested;

means for acquiring data from the emulator unit necessary for carrying out a test program; and a device test emulator which provides a test signal to the device emulator based on the acquired data and compares the resultant signals from the device emulator with the expected data and stores the comparison result therein;

wherein said tester emulator, device emulator, data acquiring means and device test emulator are provided within a software of said test system.

2. A software in a semiconductor test system for testing a semiconductor device by applying a test signal to a semiconductor device under test in synchronism with a reference period and comparing the resultant output of the semiconductor device under test with an expected value to determine whether the semiconductor device functions correctly or not, comprising:

test program input means for providing a test program to specify various test conditions necessary to test the semiconductor device including a waveform of a test signal to be supplied to a predetermined terminal of the semiconductor device under test, the test program being changed in its test description format when there is a change in hardware of the semiconductor test system;

compiler means for compiling and interpreting the test program to convert the test program to object codes;

compiler interface means for storing data indicating the hardware characteristics of the semiconductor test system in a table format to assist the compilation and interpretation of the test program in the compiler means;

library means having data tables based on the specification of the semiconductor test system for converting the data compiled and interpreted by the compiler means to hardware format data;

driver means for providing the hardware format data to a data bus to transfer the data to registers in the hardware of the semiconductor test system; and an emulator which receives the data formed by said library means from the driver means and stores the data in assigned memory areas and emulates the specification and operation of each of said hardware based on the data stored in the memory area to such a degree that operations of registers in the hardware are emulated, and the emulator including:
a rate emulator unit for generating data defining a test signal period;
a pattern generation emulator unit for generating a test signal based on the test program; and
a frame processor emulator unit for formatting the test signal based and producing timings of the test signals based on the data from the rate emulator unit and the pattern generation emulator unit;
wherein, the library means is provided with new parameters corresponding to the change in the hardware of the semiconductor test system, and the data in the table format in the compiler interface means is modified in response to the new parameters in the library means, thereby the change in the test description format is converted to object codes by the compiler means with use of modified data in the compiler interface means.

3. A software in a semiconductor test system for testing a semiconductor device as defined in claim 2, further includes driver library means having data tables based on the physical specification of a register in the hardware for converting the data from the library means to data of a format to be stored in the register.

\* \* \* \* \*